United States Patent
Bowler et al.

(10) Patent No.: US 10,992,446 B2
(45) Date of Patent: Apr. 27, 2021

(54) SWITCHED AMPLIFIER FOR DATA TRANSMISSION

(71) Applicant: ARRIS Enterprises LLC, Suwanee, GA (US)

(72) Inventors: David B. Bowler, Stow, MA (US); Clarke V. Greene, Middletown, CT (US); Lawrence Hrivnak, Lowell, MA (US); Samuel Francois, Boston, MA (US); Xinfa Ma, Acton, MA (US); Bruce C. Pratt, Bedford, NH (US)

(73) Assignee: ARRIS Enterprises LLC, Suwanee, GA (US)

( * ) Notice: Subject to any disclaimer, the term of this patent is extended or adjusted under 35 U.S.C. 154(b) by 318 days.

(21) Appl. No.: 16/224,773

(22) Filed: Dec. 18, 2018

(65) Prior Publication Data

US 2020/0195413 A1    Jun. 18, 2020

(51) Int. Cl.
*H04L 5/14* (2006.01)
*H01B 11/18* (2006.01)
(Continued)

(52) U.S. Cl.
CPC ........ *H04L 5/1469* (2013.01); *H01B 11/1895* (2013.01); *H03F 1/0211* (2013.01);
(Continued)

(58) Field of Classification Search
CPC . H04L 5/1469; H01B 11/1895; H03F 1/0211; H04B 3/38; H04B 3/44; H04B 3/54; H04B 10/2972; H04B 3/58
See application file for complete search history.

(56) References Cited

U.S. PATENT DOCUMENTS

2017/0244445 A1*  8/2017  Jin .......................... H04B 3/23
2019/0190684 A1*  6/2019  Bowler .................... H04L 5/14

FOREIGN PATENT DOCUMENTS

JP       2007116340       5/2007

OTHER PUBLICATIONS

Hamzeh et al., "Data-Over-Cable Service Interface Specifications, DOCSIS 3.1", Oct. 5, 2017, 291 pages, Cable Labs.
(Continued)

*Primary Examiner* — Pao Sinkantarakorn
*Assistant Examiner* — Kabir U Jahangir
(74) *Attorney, Agent, or Firm* — Chernoff, Vilhauer, McClung & Stenzel, LLP

(57) ABSTRACT

In one embodiment, a switched amplifier is provided to amplify a data transmission. The switched amplifier may use a control signal that is received via a control signal channel in a transmission cable. Also, the switched amplifier may detect signal power to determine whether the data transmission is received at one of a first port and a second port. Data transmissions via the data transmission channel occur in a first direction and a second direction in a same frequency range in a time division multiplex (TDD) mode. Also, the control signal and data transmission are diverted from the transmission cable that transmits a type of signal different from the control signal and the data transmission. The switched amplifier is controlled based on the control signal or the signal power detected. The amplified signal is diverted in the first direction or the second direction via the data transmission channel back to the transmission cable.

17 Claims, 9 Drawing Sheets

(51) Int. Cl.
  *H03F 1/02* (2006.01)
  *H04B 3/38* (2006.01)
  *H04B 3/44* (2006.01)
  *H04B 3/54* (2006.01)
  *H04B 10/297* (2013.01)
(52) U.S. Cl.
  CPC .............. *H04B 3/38* (2013.01); *H04B 3/44* (2013.01); *H04B 3/54* (2013.01); *H04B 10/2972* (2013.01)

(56) References Cited

OTHER PUBLICATIONS

Related Application, David Bowler et al, "Full Duplex Expander in a Full Duplex Network", as U.S. Appl. No. 15/845,054, filed Dec. 18, 2017.
HomePlug Powerline Alliance: "HomePlug AV White Paper", Aug. 18, 2005 (Aug. 18, 2005), XP055320132.
International Search Report and Written Opinion Re: Application No. PCT/US2019/067178, dated Feb. 21, 2020.

* cited by examiner

SWITCHED AMPLIFIER FOR DATA TRANSMISSION

CROSS-REFERENCES TO RELATED APPLICATIONS

The present disclosure is related to U.S. patent application Ser. No. 15/845,054, filed Dec. 18, 2017, the contents of which is incorporated herein by reference in its entirety.

BACKGROUND

As data usage is increasingly at rates that are overwhelming microcell base stations and existing wireless infrastructures, it is desirable for improved solutions for carrying data to end users. In some geographic regions, installing communications infrastructure is often prohibitive due to low population density and topographical barriers.

DETAILED DESCRIPTION

Described herein are techniques for a data transmission system. In the following description, for purposes of explanation, numerous examples and specific details are set forth in order to provide a thorough understanding of some embodiments. Some embodiments as defined by the claims may include some or all the features in these examples alone or in combination with other features described below and may further include modifications and equivalents of the features and concepts described herein.

Figure 1:
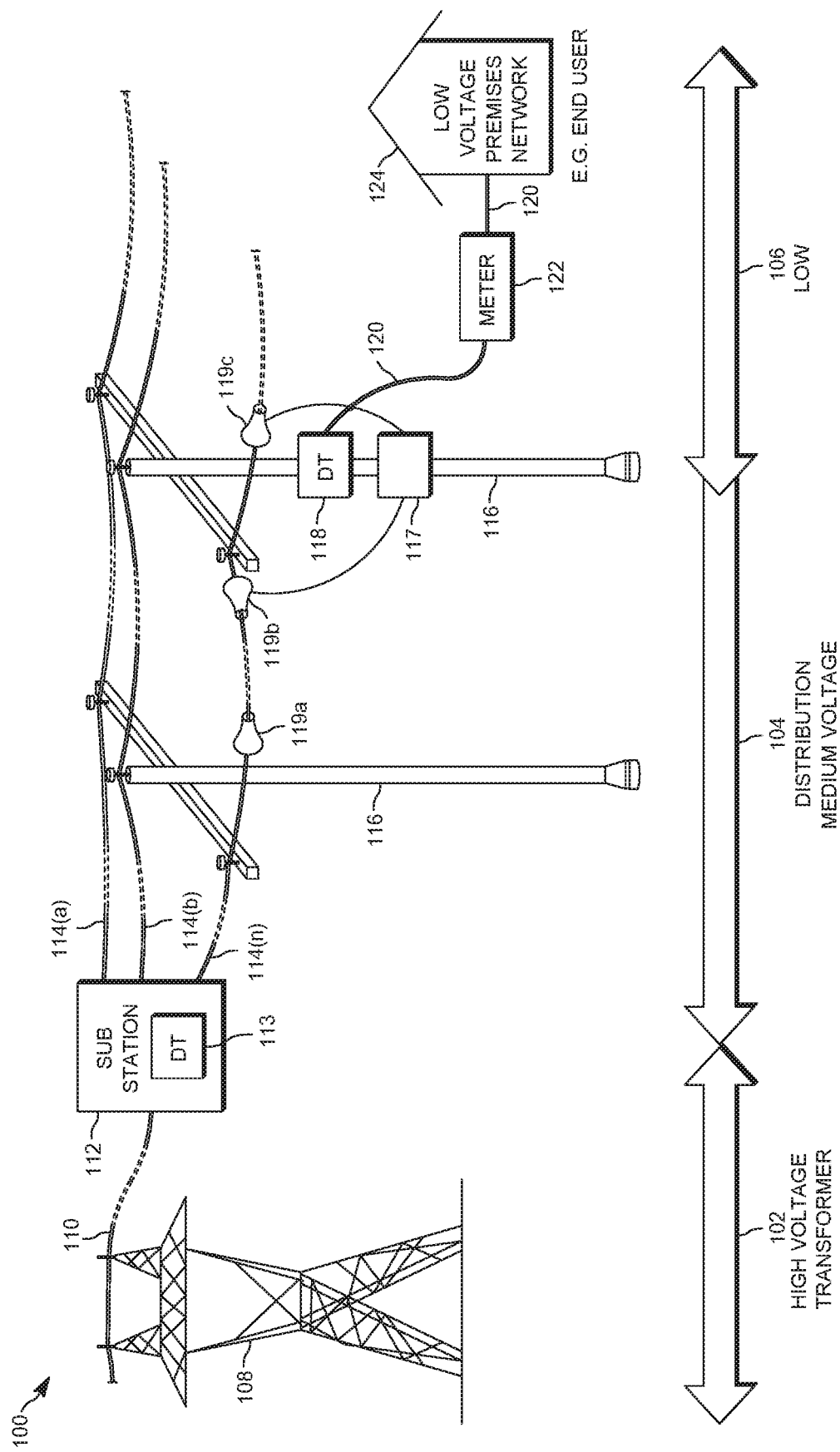
FIG. 1 illustrates a transverse magnetic wave devices that may emit and receive such data signals over the power lines.

FIG. 1 illustrates an example power distribution system 100 that may include components for power generation, transmission, and delivery. The power distribution system 100 may include a high voltage segment 102, a distribution medium voltage segment 500, and a service low voltage segment 106. Some common components found in a power distribution system are shown by way of illustration in FIG. 1, including a high voltage transmission tower 108, high voltage power lines 110, substation 112 with substation distribution transformer (DT) 113, medium voltage power cables 114(a), 114(b) . . . 114(n), utility poles 116, local distribution transformer 118, a transverse magnetic wave device 119, low voltage power lines 120, meter 122, and a low voltage premises network or end user 124.

As shown in FIG. 1, high voltage transmissions may originate from a power source 108 for transmission over high voltage transmission lines 110. The power source 108 may distribute long distance transmission on high voltage transmission lines 110 to one or more substations 112 with substation transformers 113, which then each transmit over medium voltage power cables 114. Medium voltage power cables 114 may distribute electrical power to residential neighborhoods, commercial areas, industrial areas, or other areas where such power lines reach. The power distribution system 100 may use one or more local transformers 118 along utility poles 116 in the distribution medium voltage segment 104 to ultimately distribute power over low voltage power lines to end users 124.

Transformers 113, 118 are often referred to as step down transformers, because they "step down" the input voltage to some lower voltage. Transformers, therefore, provide voltage conversion for the power distribution system 100. For example, when power is carried from a substation distribution transformer 113 to a distribution transformer 118, power may first be converted for transmission from high voltage to medium voltage at the transform substation 113 for transmission over medium voltage power lines, and then converted at the distribution transformer 118 from medium voltage to low voltage for transmission over low voltage power lines 120 to the low voltage systems, which may include end users such as 124. Such power distribution system 100 may enable power to be carried from the distribution transformer 118 to the customer premises 124 via the one or more low voltage power lines 120. The local distribution transformers 118 typically feed anywhere from one to ten customer premises 124, depending upon the concentration of the customer premises 124 in a particular region. The local distribution transformers 118 may be distributed based on a number of customers to be serviced and may be installed in locations along the power distribution system, such as pole-top transformers located on a utility pole as shown in FIG. 1, pad-mounted transformers located on the ground, or transformers located under ground level.

Power distribution systems include numerous segments related to power at different voltages. In the United States, the power distribution may include an extra-high voltage segment (not shown) including system voltages in the range of 230 kV-1100 kV. The high voltage segment 102 may currently use power over the power lines in range of 69 kilovolts (kV) to in excess of 800 kV in a range of 69 kV-230 kV. The distribution medium voltage segment 104 distributes power in the range of 1,000V to 100,000V 600 V-69 kV. The segments of the power distribution system 100 that are connected to the customers premises typically are service low voltage segments 106 having a voltage under 600 V between 100 volts(V) and 240V, depending on the system. It should be understood, however, that such ranges may vary by region/country, and disclosed herein are techniques that are operable over different ranges of voltage and different cable diameters. As disclosed, embodiments are described that are operable independent of the power or voltage on the power lines, including embodiments that are passive. Also described are embodiments that are designed to accommodate the power lines, e.g., using certain materials to avoid contact voltages and short circuits.

As described above, the transition from one segment to another typically is accomplished with a transformer. For example, the transition from the medium voltage segment to the low voltage segment of the power distribution system typically is accomplished with a distribution transformer 118, which converts the higher voltage of the medium voltage segment to the lower voltage of the lower voltage segment. In the service low voltage segment, the distribution transformer 118 may be connected to the low voltage premises 124 through a meter 122. As disclosed in more detail below, the distribution transformer may not be part of the transmission using the disclosed techniques, where the signal may bypass the distribution transformer. For example, referring to FIG. 1, the signal may travel along the power line, drop down through an amplifier, thereby bypassing the distribution transformer and passing from the left of transverse magnetic device 119b to the right of transverse magnetic device 119c through an amplifier or network box 117. It is possible that another transverse magnetic device 119 may be positioned in the low voltage segment, e.g., along low voltage line 119, for purposes of extending in the 110 V portion of the system. However, wireless communication is usually available in the low voltage segment for delivery of signals output from the transverse magnetic device 119 to a customer 124, such as via 5G or Wi-Fi technologies or the like.

Power distribution systems like power distribution system 100 exist throughout many geographic regions, which provide power to customers via power lines. With some modification, the infrastructure of the existing power distribution systems can be used to provide data communication in addition to power delivery, thereby forming a power line communication (PLC) system.

Power Line Communication (PLC) is a communication technology for carrying data on conductors typically used for electric power transmission, enabling sending data over existing power cables. In other words, existing power lines, that already have been run to many homes and offices, can be used to carry data signals to and from the homes and offices. However, the standard PLC presents a two-wire solution, and it is not practically applicable to the medium voltage power line. In addition, PLC has a narrow band and a broadband scheme, only up to 250 MHz. PLC has limited bandwidth or data rate. The guide transverse magnetic wave transmission desirable for transmission along the power line can have support a very high date depending on the operating frequency range.

FIG. 1 illustrates a transverse magnetic wave devices 119a to 119c that may emit and receive such data signals over the power lines, and embodiments for the transverse magnetic device 119 are described in more detail below. Power line communication is also referred to as power line carrier, mains communication, power line telecommunications (PLT), and power line networking (PLN).

While the concept of communication using the power distribution system may seem straightforward, there are many technical problems that arise when using a power-line communication system. For example, transformers used in power line systems may prevent propagation of a system; many power line systems are limited to a type and thickness of cable; concerns that using power line systems for sending data will cause radio interference; most existing installed overhead power lines are not designed for the purpose of high speed data communications and are very susceptible to interference, where the quality of the transmission power lines, including type, age, and number of joints, may have an impact on reliability for communicating data signals, and there are concerns that a bi-directional communication system cannot be installed to the existing infrastructure and/or be installed without disrupting power to customers during installation or after, just to highlight a few examples. Additionally, federal regulations limit the amount of radiated energy of a power line communication system, which therefore limits the strength of the data signal that can be injected onto power lines (especially overhead power lines).

In one or more embodiments disclosed herein, communication techniques in a medium-voltage and low-voltage portion of the power distribution system are adapted to utilize the utility-owned infrastructure in the power distribution network to provide a reliable and affordable communications channel. The disclosed communication systems, devices, and methods may be used to effectively transform the power distribution system in to a communication infrastructure. In one or more embodiments, PLC solutions are used to connect elements in power grids, which is particularly useful where no other reliable communication channel is available. In one or more embodiments disclosed herein, the data may be sent while the power cables are simultaneously used for electric power transmission or electric power distribution to customers. In one or more embodiments disclosed herein, data may be sent while the power cables are not energized, sending data signals regardless of whether the power lines are energized and distributing electrical power at the same time.

For simplicity, FIG. 1 does not depict all components in a power distribution system, but highlights certain components that may be used to implement a power line communication system. Thus, it should be understood that FIG. 1 does not include all components that enable a power distribution system or a power line communication system, as aspects of conventional power distribution and power line systems are known.

As disclosed in more detail below, the power line communication system may include a transverse magnetic wave device 119 that emits a data transmission as a transverse magnetic wave guided by an outer surface of a transmission medium, e.g., the medium voltage power cables 114.

Figure 2:
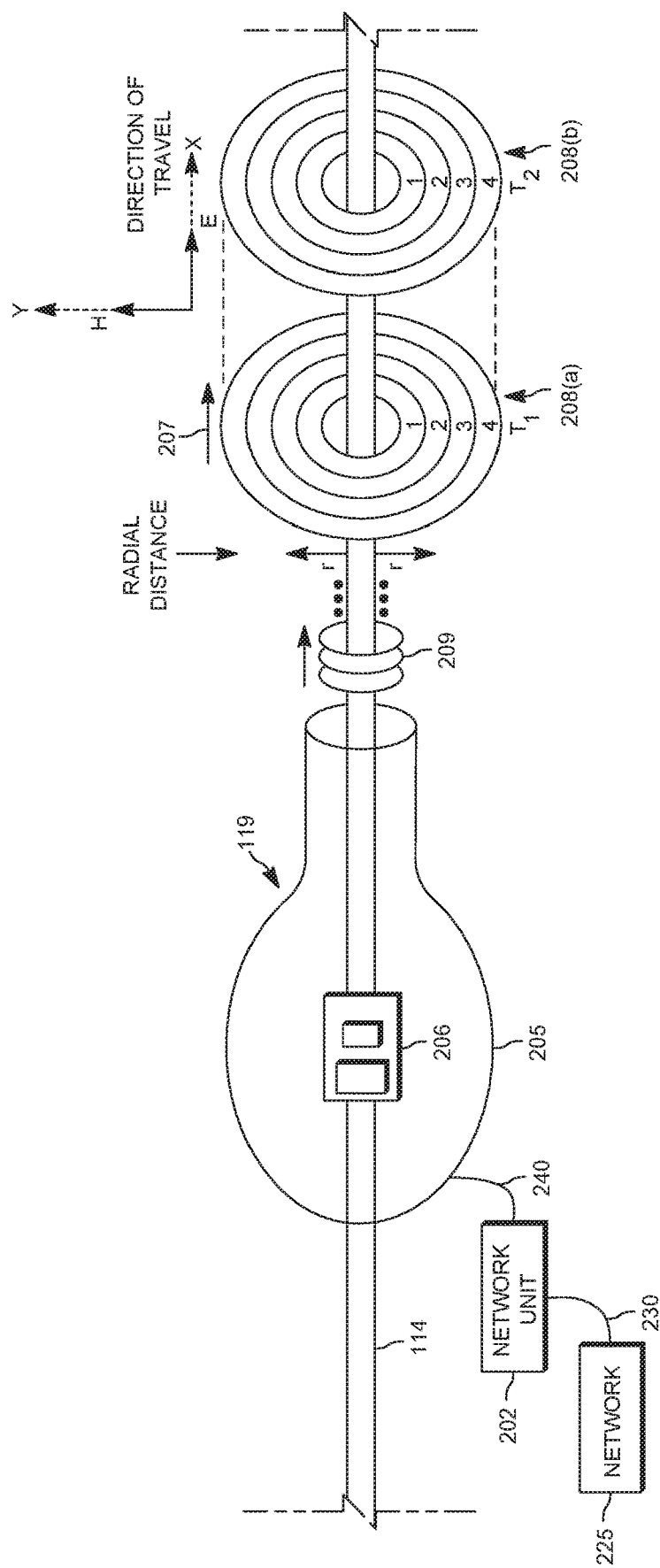
FIG. 2 depicts an example transverse magnetic device in accordance with one or more embodiments of this disclosure.

FIG. 2 depicts an example transverse magnetic device 119 in accordance with one or more embodiments of this disclosure. The transverse magnetic device 119 may transmit and/or receive signals and convert them into transverse magnetic waves for emitting along a transmission medium, such as along the medium voltage power cable 114 also shown in FIG. 1. The device 119 is in communication with a network unit 202 via connection 240, which receives information from a data source. By way of example, FIG. 2 depicts receipt of information from a network 225 over connection 230, but it should be understood that any source of information that can deliver the signals to a component in the disclosed transverse magnetic wave transmission system is applicable. Transmissions received and/or generated by the network unit 202 can be directed towards devices communicably coupled to the cable 114. For example, network unit 202 may provide data received over the network 225 in transmissions to the transceiver 119 for transmission over medium voltage power cable 114 using the transverse magnetic wave transceiver 206.

The network unit 202 may receive a signal over connection 230 from a network 225 and generate a transmission based on the signal and a carrier wave. The carrier wave signal can be modulated by the signal, and the resulting transmission can be delivered from the network unit 202 to the transceiver 119 via signal communication line 240. The communication between the network unit 202 may be based on existing transmission protocols and standards, such as MoCa and Wi-Fi standards. The signal communication line 240 may be a waveguide or transmission line that facilitates transportation of the millimeter-wave band transmission from the network unit 202 to the transceiver 119. The network connection 240 can be physical such as a fiber and/or cable, or wireless, such as Wi-Fi or 5G. For example, examples herein are described where the signal is in the form of an electromagnetic wave delivered through a coaxial connection 240.

FIG. 2 illustrates example transverse magnetic device 119 having an enclosure 205 and transverse magnetic (TM) wave transceiver 206. As shown in FIG. 1, the TM wave transceiver 206 may be integrated with enclosure 205 for installing the TM device 119 along the medium voltage power cable 114 in a power distribution system 100. Generally, a transceiver is a device comprising both a transmitter and a receiver that are combined and share common circuitry or a single housing, such as enclosure 205. As described in more detail below, the TM wave transceiver 206 may function as a transmitter of surface waves and as a receiver of surface waves. In some embodiments, a surface wave is a signal that propagates along a surface, such as the surface of the power cable 114. As shown, the TM wave transceiver 206 may be positioned along a transmission medium 114 for transmission of surface-waves along the medium voltage power cable 114. As used herein, the surface-line conductor, power lines, transmission wires, wire, cables, and the like refer to the transmission medium over which the disclosed surface waves may propagate, such as power cables 114. The term waveguide as used herein may refer to a structure that conveys signals, including the transmission medium along which a surface wave propagates (on the surface, not inside).

Upon receipt of information via connection 240, the TM wave transceiver 206 may initiate signal energy onto a conductor in a surface-wave mode. Specifically, the TM wave transceiver 206 may facilitate surface wave propagation of a data signal along the cable 114 by emitting a magnetic wave that propagates longitudinally along the surface of the transmission medium, extending emission of millimeter-waves in the range of 20 GHz-300 GHz to surface communications in the 1 MHz to 1 THz range. As described in more detail below, transverse magnetic transmissions as disclosed herein extend the system from MHz to THz. Prior systems did not account for RFI considerations and the physical size of the devices, which increases in deficits below 1 GHz. The disclosed transceiver may have a high frequency range that is dependent on cable size. When frequency range increases, the transceiver dimension may decrease. But, as described herein, a transceiver design that is too small may decrease coupling efficiency if too small in relation to the cable size. Disclosed techniques contemplate the trade-offs to maximize efficiency.

The resulting transverse magnetic surface wave propagating along the transmission medium 114 (in contrast to signals confined within a transmission medium) has a magnetic field that is perpendicular to the longitudinal axis of the transmission medium, i.e., perpendicular to the direction of propagation. FIG. 2 depicts an electromagnetic wave 209 emitted from the TM wave transceiver 206 and propagating along the transmission medium 114, generating transverse magnetic field vector (H) external to the transmission medium, i.e., perpendicular, to the general forward direction of propagation 207. Thus, the TM wave transceiver 206 may emit a wave 209 guided by the surface of the conductor and traveling along cable 114 in a direction of propagation 207, where the wave 209 is represented at time T1 by a single instance of the magnetic field 208($a$) that is generated as the signal propagates along the transmission medium 114, another instance of the magnetic field 208($b$) shown at time T2.

The signal may surround the cable as a result of a transverse magnetic mode of transmission, in contrast to modes that cause electromagnetic waves to spiral or curl around or through a cable. In one or more embodiments, a specific transverse magnetic mode or modes of transmission that generates the magnetic field with a maximum strength at a certain distance away from the transmission medium provides for optimal transfer of the signal. In ideal conditions, the same magnetic field may be generated longitudinally at each distance from the cable as the signal travels in the direction of propagation to its destination.

As shown in FIG. 2, the signal propagates longitudinally along the surface of the cable with the magnetic field surrounding the cable as it travels along the cable. FIG. 2 illustrates the signal 209 traveling longitudinally with the magnetic field 208 surrounding the transmission medium 114. cable 114

The transverse magnetic wave carrying data propagates longitudinally with varying magnetic field strengths existing at different distances form the surface of the transmission medium. By way of example, FIG. 2 depicts example signal strengths 1, 2, 3, and 4, each representing a range of signal strength as a function of the radial distance (r) of the magnetic field from the transmission medium. Thus, the signal 209 does not spiral around the cable 114 or curl around the cable in the same context as a signal that follows the right hand-rule and spirals through a cable. Rather, the magnetic field relates to a distance away from the cable and the curve that describes the magnetic field strength having a magnetic field strength that varies based on the radial distance from the transmission medium. For example, as shown by the instances of the magnetic field 208 in FIG. 2A at different times T1 and T2, the magnetic field represented by field strength 1 surrounds the cable at the same radial distance from the cable at T1 as T2.

Not all transverse magnetic modes generated by the TM transceiver 206 will persist in the field. The guided wave modes may be determined by the cable characteristics. For example, the relative strength of TM wave modes may depend on the transceiver design and relative geometry of transceiver and the cable. The structure of the modes in the guided transverse magnetic wave mode 209 may be controlled by adjusting a relative amplitude and phase of power injected into the ports on the transceiver 119 or otherwise provided to the TM wave transceiver 206. As will be described herein, other factors may influence the modes that propagate along a surface-line conductor, particularly how and which modes are propagated along the transmission medium. Also, energy associated with the transverse magnetic wave may be determined by a diameter and geometry of the conductor. Attenuation due to various factors of the operating environment may occur. For example, attenuation of the magnetic field surrounding the cable may occur due to a poor condition of the transmission medium, ineffective coupling of the signal to the transmission medium, an increasing distance from the transmission source, a poor performance of the transceiver, interference on the transmission medium, decreasing signal strength, availability of power, etc.

Disclosed herein are techniques for minimizing losses and facilitating a tighter coupling of the signal 209 to the transmission medium, which may thereby, among other things, improve performance, decrease the number of components required in the power line communication system, and decrease the needs for power. In one or more embodiments, a primary transmission mode (or modes) may be more effectively transmitted using the disclosed transceiver 206 having enclosure 205.

Transverse magnetic (TM) waves 209 emitted from the TM wave transceiver 206 may propagate along the transmission medium 114 with the magnetic field transverse to the direction of propagation, while the electric field is normal to the direction of propagation. Reference is made herein to the Transverse Magnetic mode due to its effectiveness over longer distances.

The transverse magnetic (TM) waves are characterized by a magnetic vector (H vector) that is perpendicular to the direction of propagation, i.e., transverse component, and the electric field component parallel to the direction of propagation, i.e., longitudinal component. This is in contrast to transverse electric (TE) waves, having an electric factor always perpendicular to the direction of propagation, and transverse electromagnetic (TEM) waves used within coaxial and open cable feeders. TEM waves are characterized by the fact that both the electric factor (E vector) and magnetic vector (H vector) are perpendicular to the direction of propagation and neither are in the direction of propagation.

In one or more embodiments disclosed herein, the transmission medium may be a single-wire transmission line, such as a single-line conductor, for transmitting guided surface wave modes, including electrical power or signals, using a single electrical conductor. TEM waves use a coaxial connection having a ground connection and a return current when a signal is transmitted, and generally require at least two conductors. In contrast, the single wire system used for transmitting transverse magnetic waves does not require and/or include a return. A single-wire transmission line transmits electrical power or signals using a single electrical conductor in contrast to a pair of wires or multiple conductors. A single-wire transmission line differs from the use of the earth to effectively form a second conductor because there is no second conductor of any form in a single-wire transmission system.

It is notable that in the present embodiments, the transverse magnetic wave transceiver 206 emits signals in one or more transverse magnetic modes, in contrast to transverse electromagnetic modes occurring in a coaxial connection and having a return. Propagation of a TM mode produces a non-zero longitudinal component of the E-field, in contrast to TEM mode in coax which produces only a transverse E-field. Thus, while many conventional systems may refer to use of a transmission medium or waveguide, the type of mode generated more particularly defines the nature of the transmission medium or waveguide.

Over a single-conductor transmission line, such as medium voltage power line 119, transverse magnetic modes (TM) may be excited by a displacement current. Thus, while TEM mode is excited by real current, a TM wave is excited by the displacement current. In the case of transverse magnetic waves, a conductor that comes near or crosses into a boundary where the magnetic field is generated along the conductor may interfere with the transmission. For example, a nearby conductor other than the line may provide a termination point and thus reduce energy coupled in to the transverse magnetic wave. In general, impairments have more influence on the energy loss of the transmission the closer the impairment is to the surface of the transmission medium. At larger distances from the signal and conductor, moving away from the boundary of the magnetic field generated by the transverse magnetic wave, a conducting impairment may have little to no impact on the magnetic field. Thus, it is desirable to minimize interference in the space around the cable through which the signal and resulting perpendicular magnetic field extends.

Figure 3A:
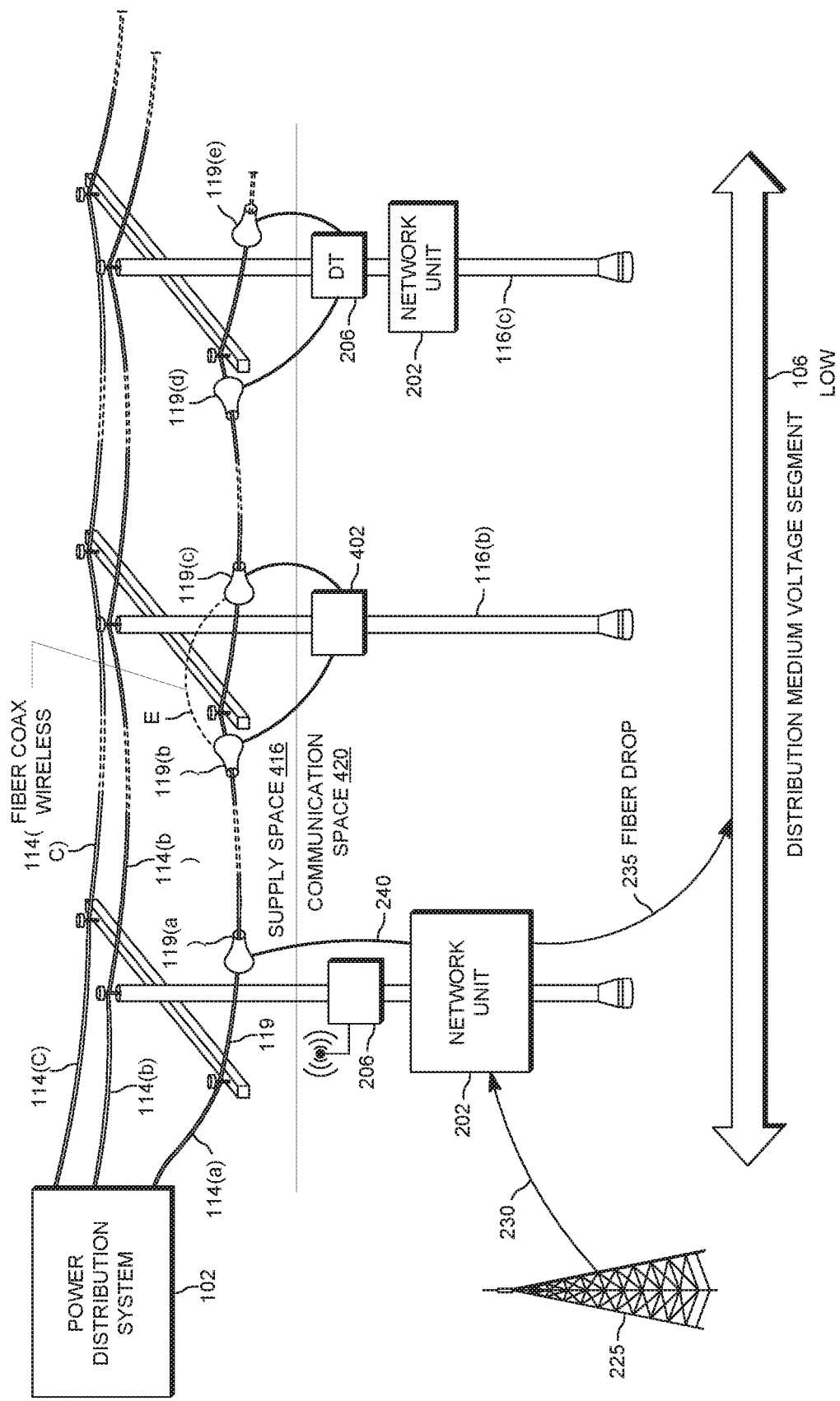
FIG. 3A illustrates a network unit, which may be communicably coupled to a network connection.

FIG. 3A illustrates a network unit 202, which may be communicably coupled to a network connection 225, such as a microcell site. The network unit 202 located in the power distribution system 100 can be connected to the microcell site 230 via a connection 230, such as by fiber and/or cable. It should be understood that additional connections 230 may be used, such as a wireless component, either active or passive. As described in more detail below, the network unit may be coupled to an access point 204 for distributing signals to end users at customer premises 124.

Disclosed herein are techniques for distributing data to end users that may be employed instead of or alternatively to fiber or physical connections and/or the use of antennas. Conventionally, access equipment on a utility pole may be configured with a physical connection, such as a fiber drop 235 shown extending from the network unit 202. Where available, the fiber drop may to deliver content to end users 124 or to a location further downstream. However, such solution requires a fiber or cable installed to reach the termination point. Further, equipment on the utility pole may be integrated with an antenna system (not shown) to provide connectivity for mobile devices. It is common that such antenna system is integrated in to the infrastructure of the power distribution system, with network units and antennas positioned on the pole architecture and along the power lines, separately communicating information between the microcell sites to mobile devices that are not located in a static position. However, antennas operate in free space and transmissions distances are limited.

As disclosed herein, the network unit 202 may be communicably coupled to the transceiver 119 that is positioned along the power lines, the transceiver for emitting signals along the power lines present in the power distribution system. Generally, the connection between the network unit 202 and the transceiver 119 would be physical. However, there is a possibility for passive wireless and active wireless. The transceiver 119 can receive signals from the network unit 202 with information that originated in the network 225 and transmit the signals over the power lines. For example, via network connection 230, the network unit 202 may combine the network signal received from the network connection 225 with a carrier-wave signal, generate a transmission, and send the transmission to transceiver 119 through connection 240. Transceiver 119 can launch or otherwise emit a data transmission as a guided transverse magnetic wave on the surface of the medium voltage power line.

It is notable that antennas used for transmitting data from the network connection 225 to mobile end users 124 are distinguishable from the disclosed power line communication system that uses transceivers to emit surface-wave transmissions. For example, when radio waves encounter an antenna they are converted in to electrical energy and radiate in all directions from a center point of the antenna in space until they are reflected or absorbed. Antennas rely on free radiation or over-the-air links between antennas, in contrast to the use of a transmission medium or waveguide. As disclosed herein, surface wave transmissions that propagate along a conductive transmission medium use magnetic fields having circular geometries to propagate along the transmission medium. In fact, as described with respect to one or more embodiments below in more detail, a tighter coupling of the signal and thus the transverse magnetic field to the transmission medium is desirable to minimize free radiation. Transmission in free space would prevent certain features of the disclosed techniques from functioning.

A device 119 on or near the utility pole can also receive a transmission over the power lines and forward it to the network unit 202. The network unit 202 can down-convert the transmission and forward it to the network L or to a microcell J.

The device 119(a) may connect to another device 119(b) symmetrically positioned along the same transmission medium. The symmetrical device 119(b) may function as a repeater by transmitting the energy received via a transceiver 206 in the device 119 to a repeater 402 and back up to another device 119(c) for continued transmission of the surface-wave propagation of the signal along the surface line conductor 114.

Figure 3B:
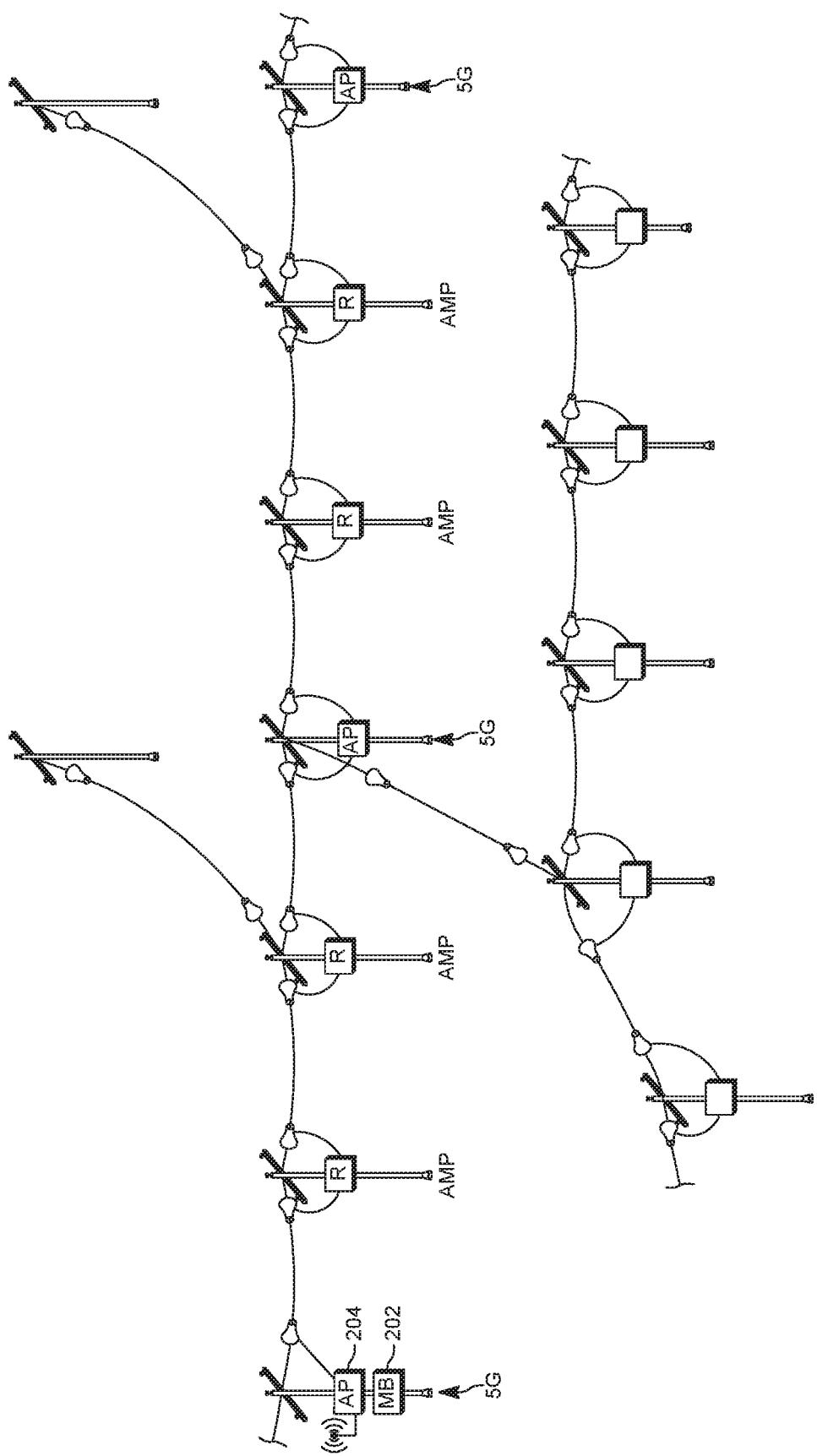
FIG. 3B illustrates a larger network of utility poles with network boxes, access points, and repeaters depicted at various points within the network.

FIG. 3B illustrates a larger network of utility poles with network boxes 202, access points 204, and repeaters 402 depicted at various points within the network. FIG. 3B depicts multiple transceiver devices 119, some of which initiate propagation of the surface wave signal and some of which serve as repeaters of a signal received along the surface of the surface conductor. As shown, the repeaters may serve to connect network units with components several utility poles away for continuing a signal originated at the network unit 202 using only the transceiver device, repeaters and the transmission medium.

The couplers and repeaters may be connected along segments of the power line as shown in FIG. 3B, but may also be connected through different types of connections. For example, a first repeater may be connected to another repeater via physical, fiber, Ethernet, optical, or wireless interfaces, as shown by connection E, which should be understood to represent a physical connection and/or a wireless path of communication. The wireless connectivity between components in the PLC, such as the wireless embodiment for connection E, may be used when power line connectivity is lost between neighboring repeaters.

The repeaters R may be positioned in the network of electric power lines to permit information to travel longer distances on the power lines, enabling PLC communications capability. For example, the repeater and power line exchange may include the communication of data (a signal in a digital format) between transceiver for (upstream) and downstream communication.

In embodiments, repeaters R may be mounted near an electrical distribution transformer or similar location providing access to an electrical (medium voltage?) power line. The distribution transformer may be located above-ground or below-ground, such as suspended from a pole overhead, for example. The distribution transformer may reduce the medium voltage from the electrical power line to lower voltages at levels that may be delivered to end user consumers. In embodiments, the lower voltages that may be consumed by end users are voltages including and between 110V-220V.

The transceiver 119 and/or repeaters A may include a switch to switch between power lines. (An isolation device and/or capacitor device may be provided before and/or after a repeater in the path of upstream communication and/or downstream communication. Isolation and capacitor couplers may connect the repeaters to the power line).

Separate logical networks may be created and used over the electric power lines, such as by utilizing standard protocols such as standards. Thus, the power lines may serve to enable different services. For example, a first service provider may use the power lines for a backhaul connection between transceivers and base stations, and a second service provider may use the power lines for a logical network for WiFi hot spots, and a third service provider may use the power lines for networking electric meters. Each network may have bandwidth allocated for each application by a management system.

The transceiver 119 may be utilized by utilities for other purposes, such as to read meters, detect power outages, etc. The repeaters A may provide one or more interfaces, such as a fiber optic interface or an Ethernet interface, that interface the transceiver 119 and/or repeaters with external equipment, such as, for example, WiFi access points, transceiver stations, low voltage gateways, electric meters, or the like. Thus, the repeaters A may receive communications over a power line, including external communications, and communications over Ethernet, and/or fiber.

Referring back to FIG. 3A, it is important to note that the location of the components used for the power communication line are subject to requirements defined by the FCC and National Electric Safety Code. For example, one of the most fundamental safety recommendations by the National Electric Safety Code (NESC) is the separation of supply space (power distribution) and communications space on utility poles. Thus, consistent with current regulations of the FCC and electrical safety codes, FIG. 3A illustrates a communication space and a supply space with requirements as to the types of components that may exist in either space.

The supply space 416 (or the electrical supply zone) is located in the uppermost area of a pole, where electrical equipment (including electric distribution cables, transformers, and capacitors) is found. Supply space wiring may include different voltages, and often consists of non-insulated conductors. For safety reasons, the highest voltages are in the highest position on the pole. Only authorized electrical workers can work in or above the supply space, and is also referred to as the power company's space.

The communications space 420 is the lowest space on the pole and is located below the supply space. Attachments in this space include cable, broadband, fiber, telephone, traffic-signal control wiring, and more. The communication space is generally the location on the utility pole that is opened up for CATV and telecom providers for installing equipment for communications.

Generally, the communication space exists below the supply space. The communication space is the space where workers can work safely and passage through or under which is safe. The supply space includes the energized electric portion of the pole space, which poses an unsafe spacer for workers. Presently, the NESC requires 40 inches between the lowest energized electric line and communications cables/equipment. Thus, it is generally understood that the supply space encompasses the energized portions of the space, which is a space that can pose a danger to workers or contractors that are working on the pole.

Some utility services have installed communications devices in the supply space, such as placing antennas at the top of the pole, as the communications devices themselves may not present a danger by presence in the supply space. However, it is undesirable and often a violation of utility industry requirements to move any supply devices in to the communication space due to the danger posed to anyone in the vicinity of the supply device, and such strict clearances defined by the industry remain the safest option.

It should be noted that there may be unused space located directly below the supply space and directly above the communication space, which may exist for safety. The neutral space is specified by the NESC to protect communications workers from dangerous voltages and to separate communications conductors from electric supply conductors. As shown in FIG. 3A, the distributed transformer, for example, may be located in the supply space.

The distance between poles may be as is conventional in a power distribution system. It should be understood that the one network unit 202 and three utility poles 116(a)-(b) are depicted in FIG. 3A for purposes of simplicity. By way of example, FIG. 1 depicts three medium voltage power lines, where one or more of the three electric power lines B may be used to enable power line communication functionality including data transmissions. Though connectivity via three power lines are provided in the illustrated embodiment, any number of power lines and associated functions with regard to the present embodiments may be employed. In an example, there may be one or more utility poles located between the poles shown in FIG. 3A, such as additional poles between utility pole 116(a) and 116(b). While transceivers are shown on each utility pole depicted in FIG. 3A, it should be understood that the network of utility poles may or may not each have a transceiver or other components described herein. Depending on distances and a performance of the transceivers 119 or condition of the medium voltage power cable 114, the poles located in between may or may not have additional transceivers and equipment to facilitate the disclosed techniques. In embodiments, the transceivers are able to emit signals along the medium voltage power line with enough signal strength to propagate along the medium voltage power lines such that retransmission by another transceiver 119 may not need to occur Turning to FIG. 3B, an example of a larger network of utility poles and components in the power distribution system to facilitate power line communication based on the disclosed techniques is shown.

Additional equipment and components that may be installed or integrated to work with the disclosed power line communication system, such as the network box 202 and access point 204. However, as disclosed herein, different embodiments may use the same, different, or a combination of components that work with the transceivers to facilitate power line communication. One network unit 202 is shown in FIG. 3B mounted to one of the example utility poles 116, but there may be more devices mounted to the poles. Further, transceivers 119 are illustrated as positioned along the left utility pole and right utility pole in FIG. 3B, but there could be one or more additional poles in between that are not shown for reasons of simplicity. The additional poles may or may not also have a transceiver 119.

Amplification of the network signal may be needed when communicated through power cables 114. However, when power is provided through power cables 114, the power does not need amplification. Some embodiments provide an amplifier in one or more repeaters 402 that amplify the network signal. The network signal is routed from a transceiver 119 to repeater 402, amplified, and then routed to another transceiver 119 (or back to the same transceiver). Transceiver 119 then continues to send the amplified signal along power cable 114.

In some embodiments, a single power cable 114 is used to transmit both upstream and downstream data transmissions. A time division duplex (TDD) mode is used such that the upstream transmission and the downstream transmission are not processed at the same time at a repeater 402. The data transmission in both the upstream and the downstream directions occurs in the same frequency range. Thus, using diplex filters to provide isolation between the upstream amplification path and the downstream amplification path may not be possible. Some embodiments provide amplifier systems that amplify data transmissions sent through power cables 114 in both the upstream and downstream directions.

The use of one amplifier system to amplify the data transmissions requires some control to route the data transmissions through different paths depending on whether the data transmissions are in the upstream direction or the downstream direction. In some embodiments, the control is limited to either being sent on the single power line or being locally generated at repeater 402.

Figure 4:
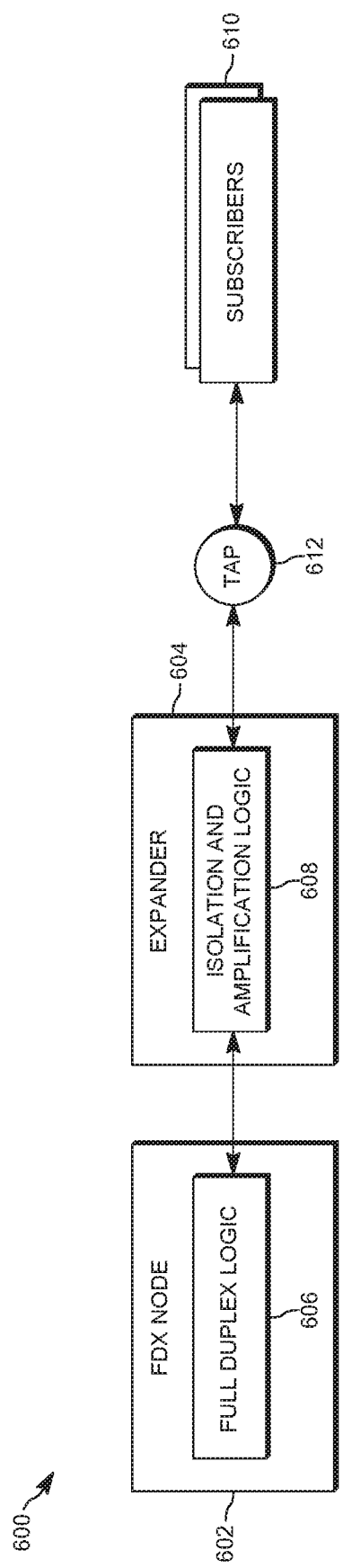
FIG. 4 depicts a simplified system for amplifying full duplex signals according to some embodiments.

FIG. 4 depicts a simplified system 600 for amplifying full duplex signals according to some embodiments. System 600 includes a FDX node 602, an expander 604, and subscribers 610. It will be understood that other components of the network may be included, such as other FDX nodes 602 and expanders 604 may be included. Further, although not shown, a head end may be located upstream of FDX node 602. In some embodiments, FDX node 602 may be part of a remote physical (PHY) device that can be located closer to the subscriber's premises, such as in a node located in the neighborhood where the subscribers are located. The relocated physical device is referred to as a remote physical device (RPD). FDX node 602 converts packets on a digital interface, such as an Ethernet interface received via a digital network, such as via optical fiber, to analog signals, such as radio frequency (RF) signals, on a hybrid fiber coaxial (HFC) network. FDX node 602 sends the RF signals to modems located at a subscriber's premises via an analog network, such as via coaxial cable.

Full duplex signals may include different types of traffic, such as data and video. In the downstream direction, signals from the head end are sent through FDX node 602 toward subscribers 610 through expander 604. A group of subscribers may be connected to a tap 612 that provides connections to subscribers 610. Subscribers 610 may include subscriber devices, such as modems that receive the downstream signals and send the upstream signals. In some embodiments, the modems include cable modems, but other devices may be appreciated, such as gateways. In the upstream direction, subscribers 610 send upstream signals toward the head end through expander 604 and FDX node 602.

In the downstream direction, FDX node 602 may receive a downstream signal from the headend and process the downstream signal using full duplex logic 606. As discussed above, FDX node 602 may receive packets via a digital network. Then, FDX node 602 sends the downstream signal to expander 604. The downstream signal is sent via an analog network. Expander 604 then amplifies the downstream signal in the analog domain. Also, in the upstream direction, expander 604 receives upstream signals and can amplify the upstream signals in the analog domain. Then, expander 604 sends the upstream signals towards the head end, which eventually reach FDX node 602. The upstream signals are sent via the analog network.

Expander 604 receives the downstream and the upstream signals in the same frequency band, which may be a range of frequencies that includes both the downstream and the upstream signals. In some embodiments, the downstream and upstream signals are sent at the same time, but in other embodiments may be sent at different times. Expander 604 may process the downstream and upstream signals using isolation and amplification logic 608, which may separate the downstream and upstream signals that are sent in the same frequency band. Isolation and amplification logic 608 then can amplify the downstream signal using a first path and the upstream signal using a second path. The amplification is performed in the analog domain while isolating the downstream signal and the upstream signal from one another. After amplification, expander 604 may send the downstream signals toward subscribers 610 and send the upstream signals toward a head end.

In some embodiments, FDX expanders 604 may replace legacy analog amplifiers in the network. The use of FDX expanders 604 allows full duplex traffic to be sent in the network without having to replace the legacy analog amplifiers with FDX nodes 602. Also, the connection between FDX node 602 and FDX expanders 604 may be transmit analog signals, such as radio frequency (RF) signals, that may be communicated over a coaxial cable instead of fiber. This means that the signals in the downstream direction from FDX node 602 to FDX expanders 604 may be in the analog domain. If fiber was used, then the communications from FDX node 602 to another FDX node may be in the digital domain, which would require the coaxial cable to be replaced between two FDX nodes 602.

The FDX system may use the switched amplifier as described herein.

Figure 5A:
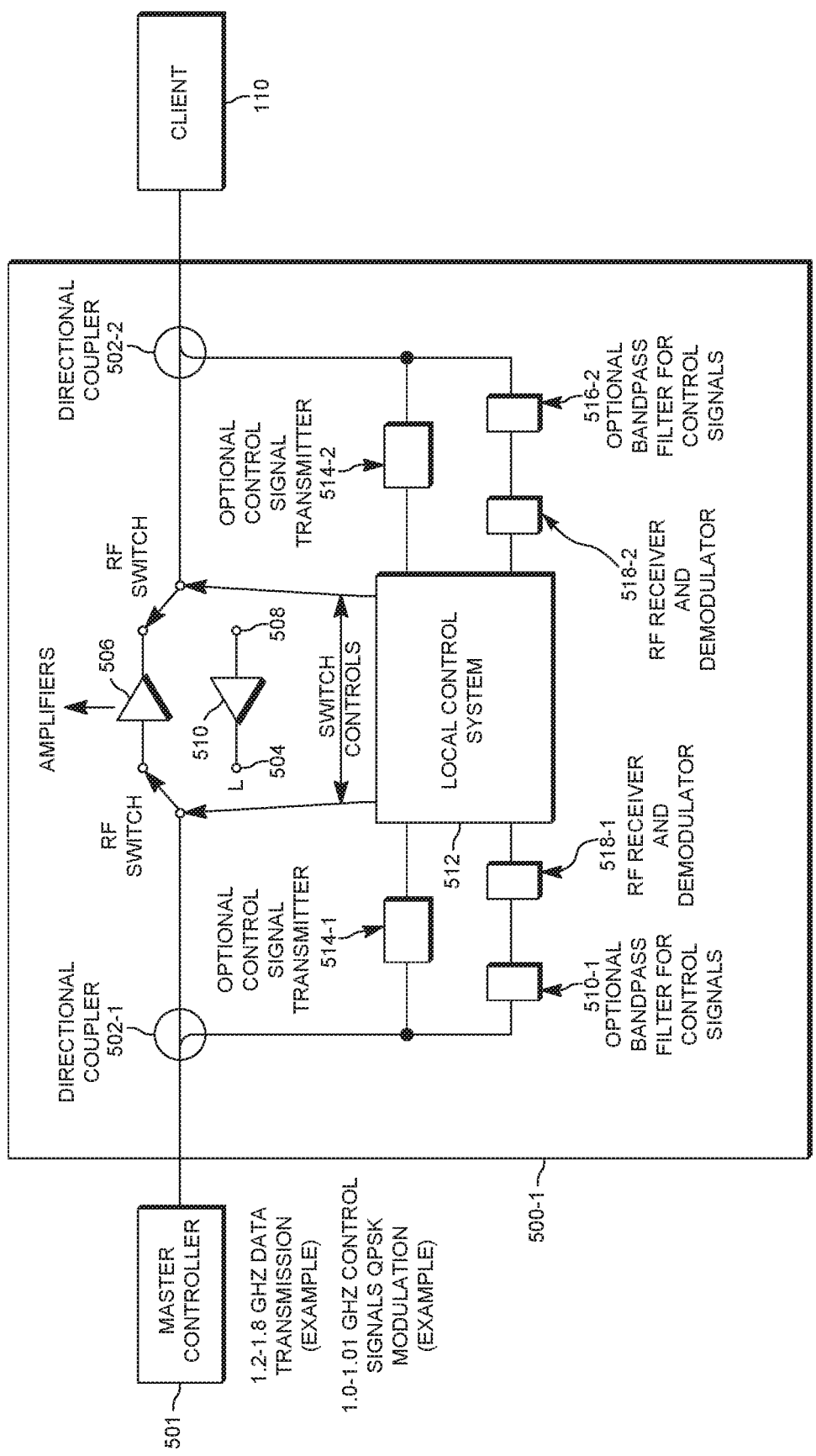
FIG. 5A depicts an example of a dual switched amplifier according to some embodiments.
Figure 5B:
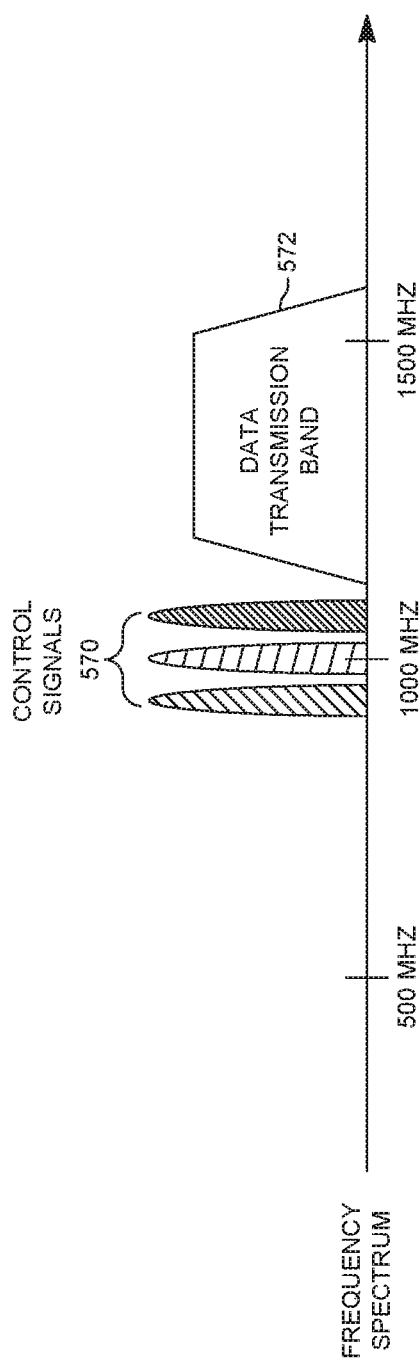
FIG. 5B depicts an example of control signals that are included at a lower frequency spectrum from the data transmission band according to some embodiments.
Figure 5C:
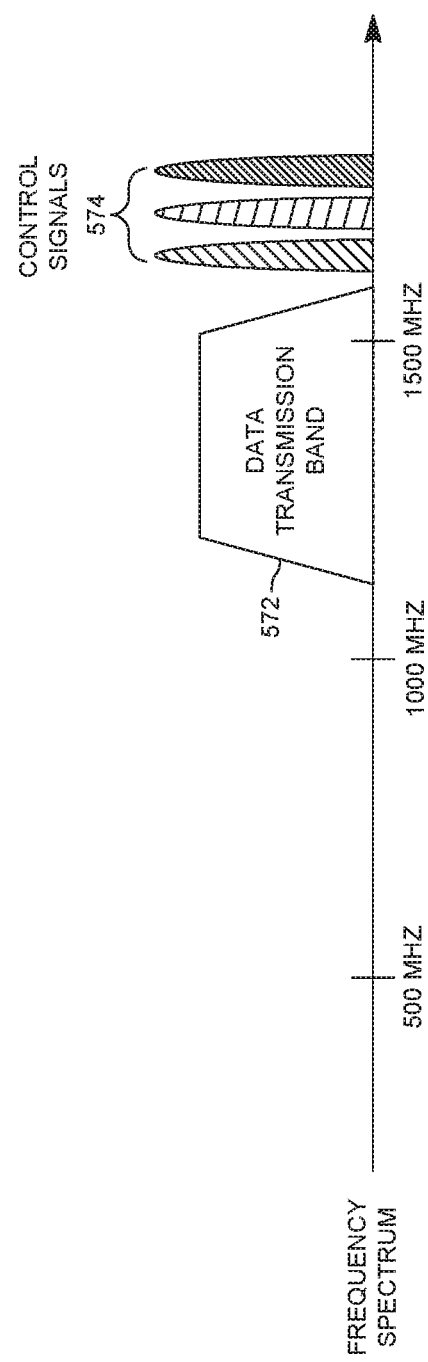
FIG. 5C depicts an example of control signals that are included at a higher frequency spectrum from the data transmission band according to some embodiments.
Figure 5D:
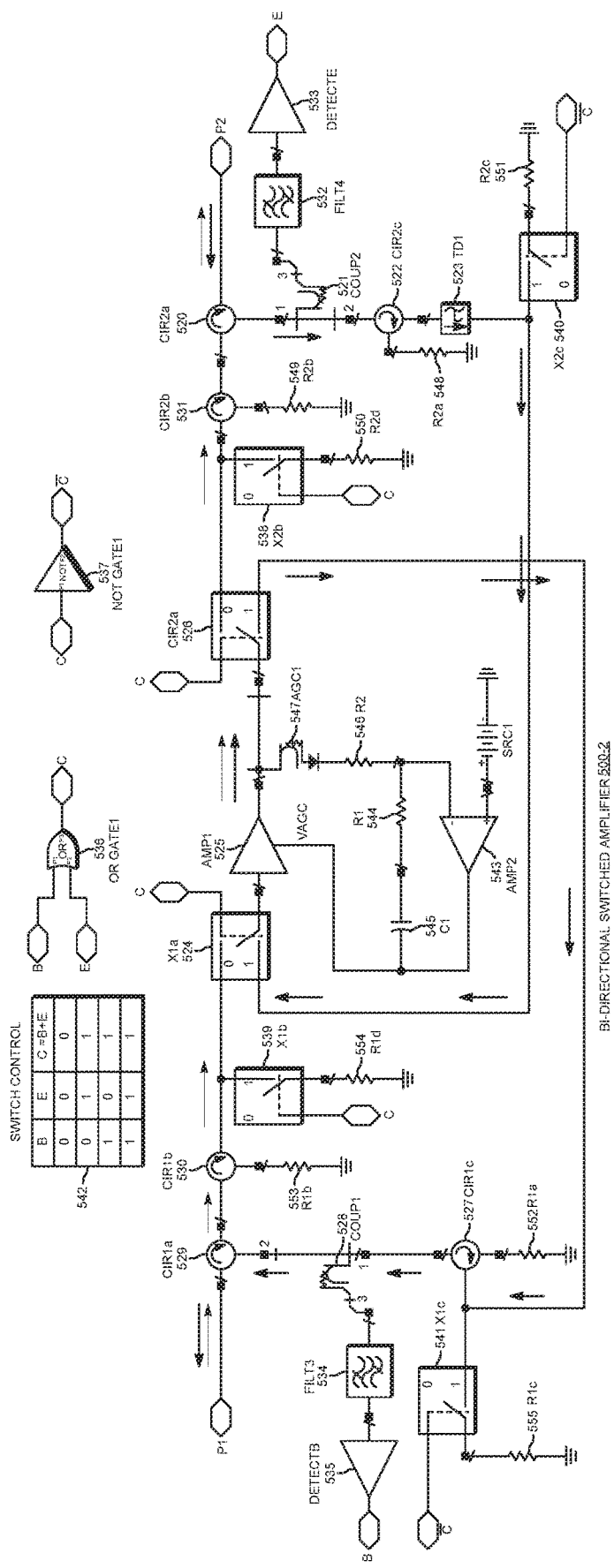
FIG. 5D depicts an example of a bi-directional switched amplifier according to some embodiments.

FIGS. 5A and 5D depict different examples of switched amplifiers 500 according to some embodiments. FIG. 5A includes separate upstream and downstream amplifiers in a dual switched amplifier 500-1 and FIG. 5D includes a single amplifier that is switched between two directions in a bi-directional switched amplifier 500-2. Both amplifiers 500-1 and 500-2 may operate in a time division duplex (TDD) mode. In this example, the upstream transmission and the downstream transmission from power cables 114 are not processed at the same time. In this example, the clients (e.g., subscriber devices in customer premises 124) cannot transmit or receive at the same time and thus the TDD mode of amplifiers 500-1 and 500-2 is acceptable because the upstream and downstream signals are being sent using TDD. Switched amplifiers 500 may be used in different types of systems that transmit signals upstream and downstream in the same frequency range.

FIG. 5A depicts an example of a dual switched amplifier 500-1 according to some embodiments. A master controller 501 controls operation of the system and dual switched amplifiers 500 within the system. In some embodiments, master controller 501 is included in network box 202. In some examples, a data transmission channel is bidirectional and operates in a frequency range of 1.2-1.8 GHz, but other types of data transmission channels may be appreciated.

The system uses a separate control transmission (bidirectional transmission or single directional) for transmission of control signals. In some examples, the control signal channels operate from a different frequency from which the data transmission uses, such as 1.0-1.01 GHz. In some examples, the control channels transmit data via Quadrature Phase Shift Keying (QPSK) modulated carriers in that band. In some embodiments, the system may use multiple control channels, each at a different frequency. One control channel is from the master controller to the amplifiers and the clients (downstream). In some examples, this control channel is arbitrarily placed at 1000 MHz. FIG. 5B depicts an example of control signals that are included at a lower frequency spectrum from the data transmission band 572 according to some embodiments. At 570, one or more control signals are included at a frequency lower than the data transmission band.

The control signals may also be included at higher frequencies. Each client has a control channel associated with it (upstream), placed at a frequency close to the downstream channel. FIG. 5C depicts an example of control signals that are included at a higher frequency spectrum from the data transmission band 572 according to some embodiments. At 574, one or more control signals are included at a frequency higher than the data transmission band 572. The channel spacing may be determined by circuit trade-offs, such as the complexity of any channel selection filters that might be used within the RF receivers and demodulators found in the master controllers, clients, and the amplifiers. Optionally, additional upstream control channels may be used within the amplifiers to allow for more sophisticated remote control of the amplifier operation and performance telemetry transmission back to the master controller 501.

Both the data transmission channel and the control signal channels follow the same transmission path, whether it is coaxial cable or other transmission links. The control signal channels are located outside the frequency range of the data transmission channel. This minimizes interference to the data transmission channel and allows for minimal interference of the data transmission channel to the control channels.

In some embodiments, there are multiple control channels used, each at a different frequency. There is a control channel from master controller 501 to amplifiers 500 and the clients 110. In this example, this control channel is arbitrarily placed at 1000 MHz Each client has a control channel associated with it (upstream), placed at a frequency close to the downstream channel. The actual channel spacing is determined by circuit trade-offs, such as the complexity of any channel selection filters that might be used within the RF receivers and demodulators found in the master controllers 501, clients 110, and the amplifiers 500. Optionally, additional upstream control channels may be used within the amplifiers 500 to allow for more sophisticated remote control of the amplifier operation and performance telemetry transmission back to the master controller 501.

Referring back to FIG. 5A, at each dual switched amplifier 500-1, the amplification (e.g., RF amplification) uses an amplification system that includes a pair of amplifiers 506 and 508 that are connected in opposite directions with respect to their inputs and outputs, but other amplifier configurations may be used. For example, the control signal configuration may be used with a single amplifier system discussed in FIG. 5D. Switches 504 and 508 are used to connect either one amplifier through a first path or the other amplifier through a second path based on a command from the master controller 501 or the client 501. This allows for bi-directional transmission and amplification using a single transmission link by using time division multiplexing. The amplifier "direction" is controlled by the master controller 501 and client 501 so that the upstream and downstream transmission traffic is properly synchronized and does not conflict. The use of switches 504 and 508 also minimizes any feedback possibilities between amplifiers 500 in the system that could potentially degrade RF performance. Other embodiments employ additional switches so that a single amplifier module can be switched between the upstream and downstream directions, reducing power consumption and cost as will be discussed below.

In addition to dual switched amplifiers 500 being bi-directional in signal transmission, it is operationally desirable for the actual dual switched amplifier 500-1 to be symmetric with respect to orientation at installation. The examples assume symmetric dual switched amplifiers 500 and will be described as such in operation, but symmetric amplifiers are not required.

Directional couplers 502-1 and 502-2 at the input/output ports of the amplifier 500 sample the incoming channels from both directions. Additionally, when the optional control signal transmitters 514-1 and 514-2 are used to transmit additional control and telemetry signals to the master controller 501, these control signals are coupled into the main transmission line through these same directional couplers 502-1 and 502-2.

RF receiver and demodulators 518-1 and 518-2 select the control signal channels from the transmission that includes the control signal and data transmission signal, and optionally using bandpass filters 516-1 and 516-2, respectively, to filter the transmission for the control signal band. RF receiver and demodulators 518-1 and 518-2 may also recover any datasets sent from the master controller or client interpretation and execution by the local control system. The dataset may be sending a change direction time, duration of the change, or a request for diagnostic information or other information, etc.

Once dual switched amplifiers 500-1 are installed into the system and the system is powered on, one initial action is for the master controller 501 to send out its control signal. The RF receivers 518-1 in each dual switched amplifier 500-1 detect which amplifier port the control signal is arriving from. Local control system 512 saves the port for later operation.

Once the downstream direction is established, dual switched amplifiers 500 are set to operate in the downstream direction. This allows control signals from master controller 501 to be sent to all clients 110. Master controller 501 polls clients 110, which respond in random time delayed fashion to minimize transmission contention on an upstream control signal channel that is pre-programmed into the client. Once each client 501 sends a unique identifier (ID), such as the unique manufacturing code in each client, back to master controller 501, master controller 501 then assigns a unique upstream control signal channel frequency to each client 501 along with an ID. Once a client 501 or dual switched amplifier 500-1 receives the ID and control signal channel frequency, it stops requesting responses. This allows for contention free communication in the upstream direction once initiation is complete. A similar approach can be used for later maintenance unit replacement or for expansion. In a similar fashion, each dual switched amplifier 500-1 that has the optional control signal transmitter 514 is assigned an ID and control signal channel frequency.

Once initialized, in operation, a local control system 512 detects control signals from the master controller 501 and client 501 that indicate which direction dual switched amplifier 500-1 should receive data transmission signals from and send data transmission signals. Local control system 512 then applies appropriate switch control signals to the RF switches 504 and 508 to attain that state. For example, local control system 512 may control switches 504 and 508 to couple the upstream signal to the upstream path and the downstream signal to the downstream path. For example, local control system 512 controls switches 504 and 508 based on whether a signal is being sent downstream or upstream. When local control system 512 detects the downstream signal is being sent, local control system 512 controls switches 504 and 508 to couple the downstream signal to amplifier 506 through a first path. Similarly, when local control system 512 detects an upstream signal is being sent, local control system 512 controls switches 504 and 508 to couple the upstream signal to amplifier 510 through a second path.

In the downstream direction, master controller 501 sends a control signal to each dual switched amplifier 500-1 and client 501 signifying that it is going to send downstream data transmission. Dual switched amplifier 500-1 may receive a downstream signal at a directional coupler 502. RF receiver and demodulator 518-1 in conjunction with local control system 512 in the first dual switched amplifier 500-1 downstream senses the presence of the detected control signal and then sets the RF switches 504 and 508 to allow downstream transmission, if they are not already in that mode. Directional coupler 502 can then send the downstream signal to switch 504. This allows for the amplifier 506 and 508 within dual switched amplifier 500-1 to increase the amplitude of the downstream data transmission and control signals to a suitable level for overcoming the insertion loss of the transmission line (e.g., power line). If there is more than one dual switched amplifier 500-1 between the master controller and the client 501, each will sense the control signal and will respond the same as the first downstream dual switched amplifier 500-1. This provides for a continuous transmission path from the master controller location to the client location through repeaters 402 and power cables 114.

In order to account for delays in the detection of the control signal and the RF switch operation, a delay period may be built into the data transmission initiation. Although this introduces some latency to the data transmission, it prevents loss of data transmission signal due to switching.

In the upstream direction, dual switched amplifier 500-1 may receive an upstream signal at a directional coupler 502-2, such as a signal sent from client 501. Directional coupler 502-2 can then send the upstream signal to local control system 512. Local control system 512 controls switch 508 to couple the upstream signal to amplifier 510. Amplifier 510 then amplifies the signal. Local control system 512 also controls switch 508 to then couple the upstream signal to directional coupler 502-1. Directional coupler 502-1 then sends the upstream signal in the upstream direction towards the master controller 501.

Other embodiments may include sending timing data with the control signals to minimize the time needed for the delay between upstream and downstream transmission. Additionally, the optional control signal transmitters 514 within each dual switched amplifier 500-1 can be used in conjunction with this timing data to eliminate the associated delay caused by waiting for one dual switched amplifier 500-1 to switch prior to the next dual switched amplifier 500-1 (or amplifiers) switching. In this case, the control signal transmission path essentially becomes parallel to the data transmission path and functions outside of any dual switched amplifier RF switching. That is, control signal transmitters 514 can transmit the control signals for other dual switched amplifiers 500-1 while processing the downstream transmission. Other enhancements may include remote amplifier performance monitoring, configuration, and system performance parameters.

In the above configuration, two different amplifiers and paths are used to amplify the downstream signals and the upstream signals, respectively. This uses multiple amplifiers 506 and 508, but only two switches 504 and 510, which may simplify the switching logic. The upstream and downstream paths are isolated by TDD in this example.

FIG. 5D depicts an example of a bi-directional switched amplifier 500-2 according to some embodiments. In bi-directional switched amplifier 500-2, the same amplifier 525 is used for both the upstream and downstream amplification, and switch poles are alternated to half duplex the upstream and downstream signals to amplifier 525. The upstream and downstream signal paths may share components other than amplifier 525. However, the overall path that is taken is different between the upstream and downstream. That is, the upstream path takes different circulator port rotations and switch poles through a first path, compared to a different second path for the downstream path.

A local detection and decision circuit changes the switch poles for each half duplex time slot in which signals are being sent upstream or downstream. In one example, the local detection and decision circuit detects when signal power is present at either upstream or downstream inputs (e.g., input P2 or input P1). When signal power is detected at input P2, the local detection and decision circuit changes the switch poles to connect input P2 to the input of amplifier 525, and output P1 to the output of amplifier 525. Similarly, as another example, when signal power is detected at input P1, the local detection and decision circuit changes the switch poles to connect input P1 to the input of amplifier 525, and output P2 to the output of amplifier 525. Different and additional coupling locations, and coupling directions, for the detection of signal power for local switching decision may be appreciated. Described herein is one embodiment of the bi-directional switched amplifier 500-2, with logic gate switch control decisions made from signal power detections of the upstream signal. Other embodiments not described herein include signal power detections of the downstream signal, and signal power detections on both upstream and downstream signals, for local switching decisions. Further, other variations on detecting the power at the inputs and performing the pole switching may be appreciated. Also, by not detecting power at that port may inherently detect power at the other port or the switching logic may be configured such that it is assumed power is detected at the other port. Further, the multiple amplifier system described in FIG. 5A may be use the local signal power detection to determine which of the first path and the second path to use in that embodiment.

In some embodiments, the bi-directional switched amplifier 500-2 receives an input signal at input P2 (e.g., the upstream direction). The input P2 signal is rotated clockwise by circulator 520 to the directional coupler 521. Circulators may be used to control the signal flow and can have three or more ports. The signal in a circulator follows a rotary path from one port to the next, always in the same rotational direction, clockwise, or counter-clockwise. The directional coupler 521 couples a small percentage of the input P2 signal to a filter 532 and detector 533. Filter 532 reduces the spurious signal levels outside of the signal bandwidth to prevent a false detection. The bandwidth of filter 532 may be narrower than the input P2 signal bandwidth to further prevent false detections. After detector 533 detects the input P2 signal, a logic 1 is output to the E input of an OR gate 536. A switch control table 542 shows that an input of E=1 at the OR gate 536 input causes the OR gate to output C=1, and each switch connected to the OR gate output (labeled with C), changes their switch pole to the C=1 state.

The large percentage of remaining input P2 signal at coupler 521 is rotated clockwise by circulator 522, and delayed by time delay 523. The period of delay is enough time for the switch poles to change to C=1 state, to prevent loss of input P2 signal. Until this point, the input P2 signal has followed a path independent of the switch pole state.

After the input P2 signal has passed through time delay 523, the local switch control logic has made the decision to change the switch poles to C=1, and switch 524 changes to connect the input P2 to the input of amplifier 525. The input P2 signal is amplified by amplifier 525, and the output at the C=1 pole of switch 526 is rotated clockwise by circulator 527 to directional coupler 528. Directional coupler 528 couples a small percentage of the amplified P2 signal to filter 534 and detector 535. Filter 534 reduces the spurious signal levels outside of the signal bandwidth to prevent a false detection. The bandwidth of filter 534 may be narrower than the P2 signal bandwidth to further prevent false detections. After detector 535 detects the amplified P2 signal, a logic 1 is output to the B input of the OR gate 536. Referring to switch control table 542, a detection of B=1 makes the OR gate output C=1, so the poles of the switches will not change from C=1 state while a signal is detected by detector 535, or detector 533 (C=B+E).

The large percentage of remaining amplified P2 signal at coupler 528 is rotated clockwise by circulator 529 to the P1 output of the bi-directional switched amplifier 500-2.

Also, any reflected signal along the path from input P2 to output P1, due to impedance discontinuity, gets rotated clockwise by circulators 520, 531, 522, 527, 529, and 530, where the reflected signals are absorbed by loads 549, 550, 548, 552, 553, 554, and the output of amplifier 525. If switches 526, 524 are non-reflective open (e.g., internally terminated when open), or reflective short (e.g., shorted to common reference potential when open), then switches 538, 539, and their loads 550, 554, can be deleted. If switches 526, 524 are reflective open, (e.g., high impedance discontinuity when open), then switches 538, 539, and their loads 550, 554, can be used. The reflected signals absorbed by loads 549, 550, 548, 552, 553, 554, and the output of amplifier 525, will provide low reflections at the P2 input, and P1 output.

After the upstream signal is no longer applied at the input P2, detector 533 and then detector 535 will detect no signal. From table 542, when the output of detector 533 is E=0, and then output of detector 535 is B=0, and both are applied at the inputs of OR Gate 536, the switch poles change to their C=0 state. With the switches in C=0 pole state, an input signal applied at port P1 in the downstream direction will be amplified by amplifier 525.

When an input P1 receives an input signal in the downstream direction, the input P1 signal is rotated clockwise by circulator 529 to circulator 530. Circulator 530 rotates the input P1 signal clockwise to switch 524. The signal at switch 524 is at the C=0 pole and is amplified by amplifier 525, and the output at switch 526 is the C=0 pole and is rotated by circulator 531 to circulator 520. The circulator 520 rotates the amplified P1 signal to the output P2 of the bi-directional switched amplifier 500-2.

Also, any reflected signal along the path from input P1 to output P2, due to impedance discontinuity, gets rotated clockwise by circulators 520, 531, 522, 527, 529, and 530, where the reflected signals are absorbed by loads 549, 551, 548, 552, 553, 555, and the output of amplifier 525. If switches 526, 524 are non-reflective open (e.g., internally terminated when open), or reflective short (e.g., shorted to common reference potential when open), then switches 540, 541, and their loads 551, 555, can be deleted. If switches 526, 524 are reflective open, (e.g., high impedance discontinuity when open), then switches 540, 541, and their loads 551, 555, can be used. The reflected signal absorbed by loads 549, 551, 548, 552, 553, 555, and the output of amplifier 525, will provide low reflections at the P1 input and P2 output.

The circulators 522, 527, 530, 531 may be eliminated from the bi-directional switched amplifier 500-2 depicted in FIG. 5D without changing the embodiment of the bi-directional switched amplifier 500-2. Eliminating circulators 522, 527, 530, 531, and retaining circulators 520, 529 in the bi-directional switched amplifier 500-2 may reduce cost and insertion loss. The eliminated circulators 522, 527, 530, 531 may be included in the bi-directional switched amplifier 500-2 to reduce reflections at P1 and P2.

Gain control loops can be used for amplifier 525 to control the output signal level. An example automated gain control loop is shown in bi-directional switched amplifier 500-2 by using detector 547, operational amplifier 543, capacitor 545, and resistors 544, 546; however, other configurations may be appreciated, including configurations when using signal detection at input/output P1 and input/output P2 of the bi-directional switched amplifier.

System

Figure 6:
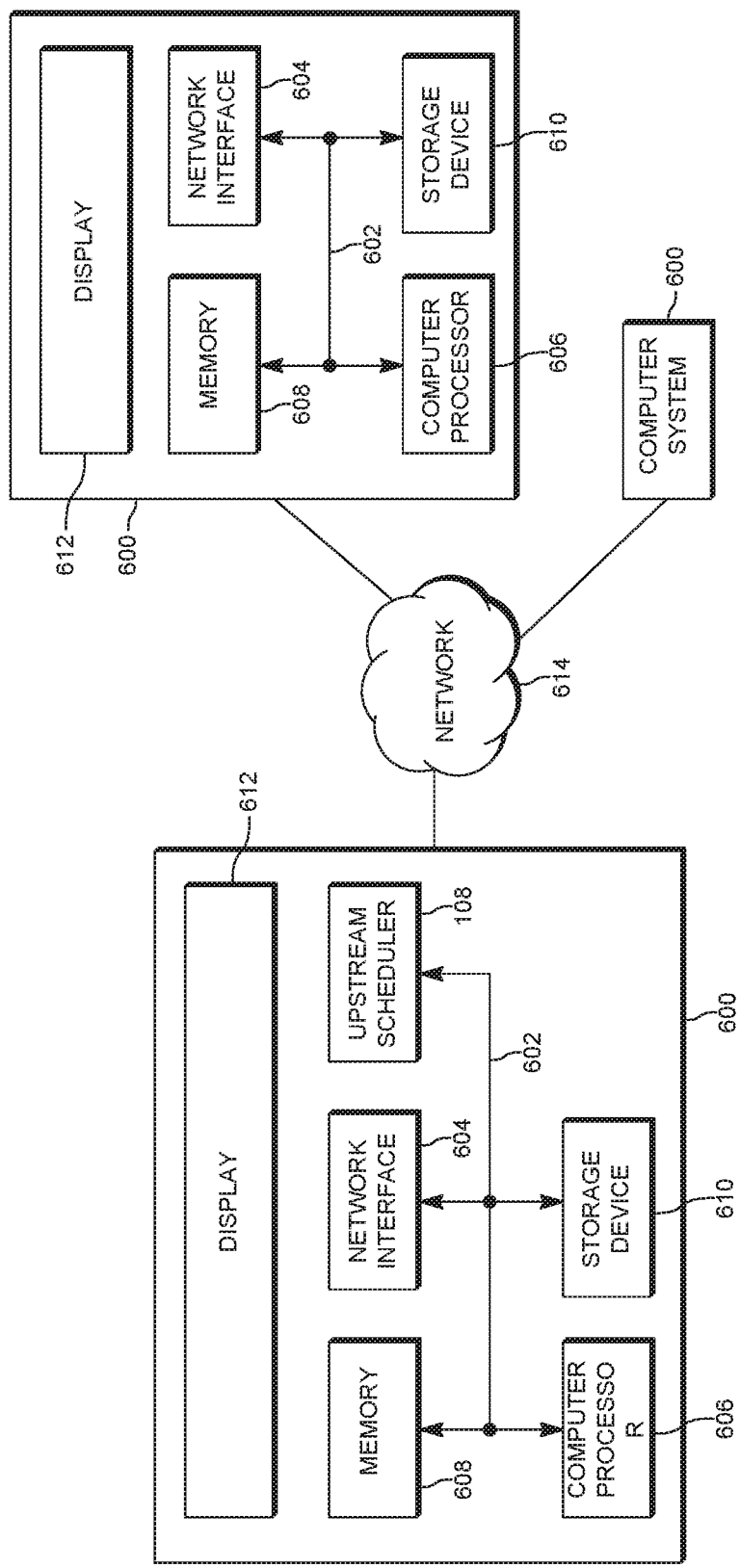
FIG. 6 illustrates an example of special purpose computer systems configured with a switched amplifier according to one embodiment.

FIG. 6 illustrates an example of special purpose computer systems 600 configured with a switched amplifier 500 according to one embodiment. Computer system 600 includes a bus 602, network interface 604, a computer processor 606, a memory 608, a storage device 610, and a display 612.

Bus 602 may be a communication mechanism for communicating information. Computer processor 606 may execute computer programs stored in memory 608 or storage device 608. Any suitable programming language can be used to implement the routines of some embodiments including C, C++, Java, assembly language, etc. Different programming techniques can be employed such as procedural or object oriented. The routines can execute on a single computer system 600 or multiple computer systems 600. Further, multiple computer processors 606 may be used.

Memory 608 may store instructions, such as source code or binary code, for performing the techniques described above. Memory 608 may also be used for storing variables or other intermediate information during execution of instructions to be executed by processor 606. Examples of memory 608 include random access memory (RAM), read only memory (ROM), or both.

Storage device 610 may also store instructions, such as source code or binary code, for performing the techniques described above. Storage device 610 may additionally store data used and manipulated by computer processor 606. For example, storage device 610 may be a database that is accessed by computer system 600. Other examples of storage device 610 include random access memory (RAM), read only memory (ROM), a hard drive, a magnetic disk, an optical disk, a CD-ROM, a DVD, a flash memory, a USB memory card, or any other medium from which a computer can read.

Memory 608 or storage device 610 may be an example of a non-transitory computer-readable storage medium for use by or in connection with computer system 600. The non-transitory computer-readable storage medium contains instructions for controlling a computer system 600 to be configured to perform functions described by some embodiments. The instructions, when executed by one or more computer processors 606, may be configured to perform that which is described in some embodiments.

Computer system 600 includes a display 612 for displaying information to a computer user. Display 612 may display a user interface used by a user to interact with computer system 600.

Computer system 600 also includes a network interface 604 to provide data communication connection over a network, such as a local area network (LAN) or wide area network (WAN). Wireless networks may also be used. In any such implementation, network interface 604 sends and receives electrical, electromagnetic, or optical signals that carry digital data streams representing various types of information.

Computer system 600 can send and receive information through network interface 604 across a network 614, which may be an Intranet or the Internet. Computer system 600 may interact with other computer systems 600 through network 614. In some examples, client-server communications occur through network 614. Also, implementations of some embodiments may be distributed across computer systems 600 through network 614.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A method comprising:
   receiving, by a computing device, a control signal via a control signal channel in a transmission cable, wherein the control signal is received from a remote device;
   receiving, by the computing device, a data transmission via a data transmission channel in the transmission cable, wherein data transmissions via the data transmission channel occur in a first direction and a second direction in a same frequency range in a time division multiplex (TDD) mode, and wherein the control signal and data transmission are diverted from the transmission cable that is configured to transmit a type of signal different from the control signal and the data transmission;
   controlling, by the computing device, switching logic to form a first path to an amplifier system or a second path to the amplifier system based on whether the control signal specifies the first direction or the second direction to couple the data transmission to the amplifier system, wherein the amplifier system amplifies data transmissions in the first direction and the second direction at different times;
   routing, by the computing device, the data transmission through the first path via the switching logic when the control signal specifies the first direction and through the second path via the switching logic when the control signal specifies the second direction;
   amplifying, by the computing device, the data transmission using the amplifier system; and diverting, by the computing device, the amplified signal in the first direction or the second direction via the data transmission channel back to the transmission cable; wherein
the control transmission channel is located at a first frequency range that is outside of a second frequency range of the data transmission channel and wherein receiving the control signal comprises selecting the control signal from the first frequency range.

2. The method of claim 1, wherein:
the transmission cable is configured to supply power as the type of signal different from the control signal and the data transmission, and
the control signal in the control signal channel and the data transmission in the data transmission channel are sent while power is being sent through the transmission cable or when power is temporarily not being sent through the transmission cable.

3. The method of claim 1, wherein:
a first control signal is received in the first direction from a controller located upstream from the computing device, and
a second control signal is received in the second direction from a client located downstream from the computing device.

4. The method of claim 1, wherein:
the control signal and the data transmission signal are routed from a first transceiver coupled to the transmission cable, and
the data transmission is amplified and then sent back to the first transceiver or a second transceiver coupled to the transmission cable.

5. The method of claim 1, further comprising:
amplifying the control signal using the amplifier system; and
sending the amplified control signal in the first direction or the second direction via the control signal channel, wherein the amplified control signal is used to control other switching logic of another computing device.

6. The method of claim 1, further comprising:
sending the control signal using a transmitter within the computing device in the one of the first direction and the second direction without amplifying the control signal.

7. The method of claim 1, wherein the amplifier system comprises:
a first amplifier configured to amplify the data transmission in the first direction, and
a second amplifier configured to amplify the data transmission in the second direction.

8. The method of claim 1, wherein data transmissions comprise upstream signals and downstream signals that are sent in the same frequency band.

9. A method comprising:
receiving, by a computing device, a data transmission at one of a first port and a second port, wherein data transmissions occur in a first direction and a second direction in a same frequency range in a time division multiplex (TDD) mode, and wherein the data transmission is diverted from a transmission cable that is configured to transmit a type of signal different from the data transmission;
detecting, by the computing device, signal power from the data transmission at the one of the first port and the second port;
controlling, by the computing device, switching logic to form a first path to an amplifier system or a second path to the amplifier based on whether the signal power was detected at the first port or the second port to couple the data transmission to the amplifier system, wherein the amplifier system amplifies data transmissions in a first direction and a second direction at different times;
routing, by the computing device, the data transmission through the first path via the switching logic when the data transmission is received at the first port and through the second path via the switching logic when the data transmission is received at the second port;
amplifying, by the computing device, the data transmission using the amplifier; and
diverting, by the computing device, the amplified signal in the first direction or the second direction via the data transmission channel back to the transmission cable; and
delaying the data transmission to allow the switching logic to form the first path or the second path.

10. The method of claim 9, wherein detecting the signal power comprises:
routing at least a portion of the data transmission to detection logic that is configured to detect the signal power.

11. The method of claim 10, wherein the detection logic determines whether the amplifier should amplify the data transmission in the first direction or the second direction.

12. The method of claim 9, wherein detecting the signal power comprises:
determining a first pole when the signal power is detected at the first port and determining a second pole when the signal power is not detected at the first port; and
using the first pole or the second pole to control the switching logic to form the first path or the second path.

13. The method of claim 9, wherein:
the transmission cable is configured to supply power, and
the data transmission in the data transmission channel is sent while power is being sent through the transmission cable or when power is temporarily not being sent through the transmission cable.

14. The method of claim 9, wherein:
the data transmission signal is routed from a first transceiver that is coupled to the transmission cable, and
the data transmission is amplified and then sent back to the first transceiver that is coupled to the transmission cable or a second transceiver that is coupled to the transmission cable.

15. The method of claim 9, wherein:
when the signal power is detected at the first port, the first path connects an input of the amplifier to the first port and an output of the amplifier to the second port, and
when the signal power is detected at the second port, the second path connects the input of the amplifier to the second port and the output of the amplifier to the first port.

16. The method of claim 9, wherein data transmissions comprise full duplex signals that are sent in the same frequency band.

17. A method comprising:
receiving, by a computing device, a control signal via a control signal channel in a transmission cable, wherein the control signal is received from a remote device;
receiving, by the computing device, a data transmission via a data transmission channel in the transmission cable, wherein data transmissions via the data transmission channel occur in a first direction and a second direction in a same frequency range in a time division multiplex (TDD) mode, and wherein the control signal and data transmission are diverted from the transmission cable that is configured to transmit a type of signal different from the control signal and the data transmission;

controlling, by the computing device, switching logic to form a first path to an amplifier system or a second path to the amplifier system based on whether the control signal specifies the first direction or the second direction to couple the data transmission to the amplifier system, wherein the amplifier system amplifies data transmissions in the first direction and the second direction at different times;

routing, by the computing device, the data transmission through the first path via the switching logic when the control signal specifies the first direction and through the second path via the switching logic when the control signal specifies the second direction;

amplifying, by the computing device, the data transmission using the amplifier system; and diverting, by the computing device, the amplified signal in the first direction or the second direction via the data transmission channel back to the transmission cable; wherein the data transmissions comprise upstream signals and downstream signals that are sent in the same frequency band.

* * * * *